US012701358B2

(12) United States Patent　　　(10) Patent No.:　US 12,701,358 B2
Bartolome Castro　　　　　　　　(45) Date of Patent:　　　Aug. 4, 2026

(54) METHOD AND SYSTEM FOR ADJUSTING AUDIO SIGNALS BY A DIGITAL SIGNAL PROCESSOR

(71) Applicant: Harman Becker Automotive Systems GmbH, Karlsbad (DE)

(72) Inventor: Raul Bartolome Castro, Munich (DE)

(73) Assignee: Harman Becker Automotive Systems Gmbh, Karlsbad (DE)

( * ) Notice: Subject to any disclaimer, the term of this patent is extended or adjusted under 35 U.S.C. 154(b) by 452 days.

(21) Appl. No.: 18/064,678

(22) Filed: Dec. 12, 2022

(65) Prior Publication Data

US 2023/0199388 A1　　　Jun. 22, 2023

(30) Foreign Application Priority Data

Dec. 21, 2021　(EP) ..................................... 21216218

(51) Int. Cl.
| | |
|---|---|
| *H04R 3/04* | (2006.01) |
| *H03G 3/30* | (2006.01) |
| *H04R 1/02* | (2006.01) |
| *H04R 1/40* | (2006.01) |
| *H04R 3/12* | (2006.01) |

(Continued)

(52) U.S. Cl.
CPC ............. *H04R 3/04* (2013.01); *H03G 3/3005* (2013.01); *H04R 1/025* (2013.01); *H04R 1/403* (2013.01); *H04R 3/12* (2013.01); *H04R 29/002* (2013.01); *G06N 3/098* (2023.01); *H04R 2430/01* (2013.01); *H04R 2430/03* (2013.01); *H04R 2499/13* (2013.01)

(58) Field of Classification Search
CPC . H04R 3/04; H04R 3/12; H04R 1/025; H04R 1/403; H04R 1/082; H04R 29/002; H04R 2430/01; H04R 2430/03; H04R 2499/13; H03G 3/3005; G06N 3/098
USPC ...................................................... 381/86, 56
See application file for complete search history.

(56) References Cited

U.S. PATENT DOCUMENTS 7,092,536 B1　 8/2006 Hutt et al.
7,155,017 B2 * 12/2006 Kim .......................... H04S 7/30
　　　　　　　　　　　　　　　　　　　　　　381/59

(Continued)

FOREIGN PATENT DOCUMENTS

| EP | 3448059 A1 | 2/2019 |
|---|---|---|
| EP | 3745738 A1 | 12/2020 |
| WO | 2016008621 A1 | 1/2016 |

OTHER PUBLICATIONS

Bass, H. et al., "On the speed of sound in the atmosphere as a function of altitude and frequency", Journal of Geophysical Research, Aug. 11, 2007, 8 pgs., vol. 112.

(Continued)

*Primary Examiner* — Ahmad F. Matar
*Assistant Examiner* — Sabrina Diaz
(74) *Attorney, Agent, or Firm* — Brooks Kushman, P.C.

(57)　　　　　ABSTRACT

The disclosure relates to a method and system for adjusting audio signals by a digital signal processor (DSP). The method comprises receiving an audio signal, adjusting the audio signal and transferring the adjusted audio signal to be output by one or more speakers. The method further comprises receiving sensor data indicative of an air environment around the one or more speakers and adjusting the audio signal based on the sensor data. The method and system may be employed in a vehicle.

18 Claims, 4 Drawing Sheets

(51) Int. Cl.
H04R 29/00 (2006.01)
G06N 3/098 (2023.01)

(56) References Cited

U.S. PATENT DOCUMENTS

| | | | | | |
|---|---|---|---|---|---|
| 2018/0136899 | A1* | 5/2018 | Risberg | .................... | H04R 3/04 |
| 2018/0167760 | A1* | 6/2018 | Yu | ..................... | H04N 21/4305 |
| 2019/0068152 | A1 | 2/2019 | Gautama | | |
| 2019/0387345 | A1 | 12/2019 | Dublin et al. | | |
| 2021/0120338 | A1 | 4/2021 | Laury | | |

OTHER PUBLICATIONS

Foley, D., "Humidity Acoustics—The Impact Humidity & Temperature Make In Room Acoustics", Aug. 12, 2014, 19 pgs., Retrieved from https://www.acousticfields.com/humidity-acoustics-the-impact-humidity-temperature-make-in-room-acoustics/ on Feb. 9, 2023.

NASA, "Convection Activities", Aug. 6, 2021, 2 pgs., Retrieved from https://www.grc.nasa.gov/www/k-12/Summer_Training/FranktonES/Convection_main_page.html on Feb. 9, 2023.

European Search Report dated Jun. 22, 2022 for European Patent Application No. 21216218.4, 9 pages.

Cramer, O., "The variation of the specific heat ratio and the speed of sound in air with temperature, pressure, humidity, and $CO_2$ concentration", The Journal of the Acoustical Society of America, May 31, 1993, 7 pgs., vol. 93, No. 5.

Communication pursuant to Article 94(3) EPC dated May 27, 2025 of European patent application No. 21216218.4, 7 pages.

European Office Action dated May 27, 2025 for European Application No. 21216218.4 filed Dec. 21, 2021, 7 pgs.

* cited by examiner

METHOD AND SYSTEM FOR ADJUSTING AUDIO SIGNALS BY A DIGITAL SIGNAL PROCESSOR

CROSS-REFERENCE TO RELATED APPLICATIONS

This application claims priority to European Application No. 21216218.4 filed Dec. 21, 2021, the disclosure of which is hereby incorporated in its entirety by reference herein

TECHNICAL FIELD

The present disclosure relates to the adjustment of audio signals. In particular, the disclosure relates to methods and systems for adjusting audio signals by a digital signal processor (DSP) based on temperature, altitude and humidity data.

BACKGROUND

Audio systems can be used in many different environmental conditions, for instance, at different temperatures, altitudes, and humidity. For instance, altitudes may span from sea level to 4000 m above sea level. Temperature can vary from −50° C. to +50° C.; and air humidity can be near 0% in desertic areas and near 100% in tropical areas. Even if audio systems are integrated into more controlled environments such as the cabin of a vehicle, altitude and humidity may change as mentioned, temperature can even at a convenient level change between 10° C. and 30° C.

The transmission of acoustic waves through a medium strongly depends on the properties of the propagation medium. For instance, acoustic pressure waveforms are affected by environmental variables such as temperature, altitude, and humidity.

Temperature affects the transmission of acoustic waves through air as well as most other propagation media due to the temperature-dependent mobility of molecules. An increase in temperature results in a higher mobility and thereby to an expansion of the medium. Vice versa, media contract when cooled. In other words, media such as air are less dense at elevated temperatures, because the molecules move faster and spread further apart (NASA, 2021, 08 06, Convection Activities).

Likewise, the propagation speed of acoustic waves changes as a function of altitude and frequency. Sutherland and Bass (2004) have developed a calculation of the propagation speed of acoustic waves and sound attenuation for altitudes up to 160 km. In a lower atmosphere, variations in the speed of acoustic waves with the altitude are dominated by temperature and wind speed changes and the vibrational and rotational relaxation frequencies, which depend on the ratio of frequency to pressure (f/P), are in the kilohertz to megahertz range. As the altitude increases, f/P and the mean free path increase, relaxation frequencies drop significantly, and the velocity dispersion intensifies due to rotational and translational relaxation. This relaxation and resulting dispersion cause a significant increase of the propagation speed of acoustic waves at fixed frequencies with altitude. Such dispersion effects may be lessened by simultaneously increased attenuation, however, decreases in travel time of several percent are predicted at frequencies slightly below 1 Hz (Henry E. Bass, 2007, On the speed of sound in the atmosphere as a function of altitude and frequency. JOURNAL OF GEOPHYSICAL RESEARCH).

Humidity affects acoustic waves caused by the moisture retention of air. In other words, in humid air, acoustic waves have to travel through both media, water and air. The composition of different molecules of different weights, mobilities and densities alters the propagation of acoustic waves (Foley D., 2014, Humidity Acoustics—The Impact Humidity & Temperature Make In Room Acoustics).

Thus, audio systems need to be calibrated to ensure proper sound quality. Such calibrations are usually employed in a controlled environment, i.e., based on a laboratory air environment around the calibration speakers, e.g., one particular combination of temperature, altitude, and humidity, in a laboratory or factory. According to this environment, gains and time lags of audio signals are tuned.

However, when an audio system is used in an environment different from the laboratory conditions, the acoustic characteristics are different from the desired behavior. Even further, if the audio system is used in a vehicle, the environmental conditions may change constantly.

This may result in unwanted audio signal disturbances, such as signal distortions, and undesired and/or unstable sound quality. Thus, there is a need for an improved method for adjusting audio signal, in particular for a dynamic adjustment of audio signals.

SUMMARY

A first aspect of the present disclosure relates to a method for adjusting audio signals by a digital signal processor (DSP). The method comprises receiving an audio signal, adjusting the audio signal and transferring the adjusted audio signal to be output by one or more speakers. The method further comprises receiving sensor data indicative of an air environment around the one or more speakers and adjusting the audio signal based on the sensor data.

In other words, the DSP receives an audio signal from an audio source. The method then allows tuning the audio signals to compensate variations in the air environment, such as temperature, altitude, and humidity of the air environment so that an adjusted audio signal can be output by one or more speakers. If the method is, for example, employed in a vehicle, the audio signal can be adjusted in real-time according to the (constantly changing) environment in the vehicle. Thereby, this dynamical tuning of audio signals enables outputting optimized sound at any time.

According to an embodiment, the sensor data is indicative of the air environment around the speaker comprises one or more of temperature data, altitude data and/or humidity data. These parameters are contributors of particular interest to the air environment around a speaker and have a particular influence on the propagation of acoustic waves. When audio signals are adjusted based on temperature data, altitude data and/or humidity data, sound disturbances may be avoided, and an optimized sound quality can be provided. For instance, gain and time lag introduced to the acoustic wave based on the environmental conditions may be adjusted. If the method is applied in a vehicle, the sensor data may be retrieved from existing sensors and measurements within the cabin of the vehicle. For instance, measurements of the temperature of the cabin of a vehicle may be performed for air conditioning systems. Similarly, sensor data indicative of altitude and humidity may be available from an engine control module as such parameters are necessary for combustion engines.

Further in an embodiment, adjusting the audio signal comprises adjusting the audio signal based on the frequency of the audio signal and/or splitting the audio signal into a plurality of signal bands using a plurality of digital filters. For instance, the audio signal may be split into a low band, a mid-band and a high band signal channel using low, mid and high pass filters, respectively. This allows for better tuning of the audio signal, because the individual channels can be adjusted individually. This is maybe because the influence of the air environment including the temperature, altitude and humidity is frequency dependent, i.e., the environmental conditions alter the different signal channels to a different extend. These inhomogeneous changes may be overcome by splitting the audio signal and adjusting the channels individually.

In another embodiment, adjusting the audio signal further comprises adjusting a gain and/or a time lag of at least a part of the received audio signal, in particular of at least one of the or a plurality of signal bands of the received audio signal. In other words, different properties of the acoustic signal may be adjusted such as gain and/or time lag. These characteristics are in particular prone to be altered by the environmental conditions including temperature, altitude (i.e., density) and/or humidity. Further, these characteristics are particularly crucial for a proper sound quality and, thus, need to be adjusted. This adjustment, based on the air environment, may be applied to all signal bands or frequencies of the acoustic signal individually or to part of the signal bands or to the whole unsplit acoustic signal.

Further according to an embodiment, adjusting the audio signal, the gain and/or the time lag is based on the sensor data as an input of a dynamic compensation transfer function. In other words, the adjustment of the acoustic signal and in particular the adjustment of the properties of gain and time lag are implemented using a dynamic compensation transfer function. This function is dependent of the properties of the air environment, in particular of the temperature, altitude and/or humidity. The dynamic transfer function may be predetermined. The dynamic compensation transfer function may include a correlation between temperature, altitude and/or humidity and the adjustment made to the audio signal and/or to the propagation of the acoustic wave through the environmental medium, i.e., air. In other words, a dynamic tuning may be achieved with an additional or alternative set of gains (GD1, GD2, GD3) and time lag (L1, L2, L3) applied to the received audio signal which are controlled by the dynamic compensation transfer function (f (T,A,H)) using temperature (T), altitude (A) and humidity (H) data as input variables. Applying a dynamic compensation transfer function allows for efficient and fast adjustment of the acoustic signal, in particular a real time adjustment of the acoustic signal.

In an embodiment, adjusting the audio signal, the gain and/or the time lag comprises determining pre-set gain and/or time lag of the audio signal or at least the part of the audio signal, determining an optimized gain and/or time lag based on the senor data, in particular by using the or a dynamic compensation transfer function and adjusting the pre-set gain and/or time lag if the pre-set gain and/or time lag differs from the optimized gain and/or time lag. The pre-set gain and/or time lag may comprise a set of acoustic tuning parameters implemented in laboratory conditions or factory conditions, i.e., a specific environment with a specific air environment, such as specific temperature, altitude and/or humidity. These pre-set data may be adjusted according to the current environment including current temperature, altitude and/or humidity as determined using a dynamic compensation transfer function, if the current conditions differ from the pre-set, e.g., laboratory or factory, conditions.

Thereby, the acoustic signals may be adjusted dynamically and in real time according to the actual environmental conditions.

In another embodiment, adjusting the gain and/or the time lag comprises determining a deterministic model of the gain and/or the time lag of the at least part of the audio signal in dependence of the sensor data and adjusting at least the part of the audio signal using the deterministic model. This embodiment resembles an option for the implementation of the dynamic compensation transfer function to the adjustment of the acoustic signal. The deterministic model may comprise the dependence of gain and time lags on the temperature, altitude, and humidity. Thereby an automated implementation of the scientific correlations of these measures is enabled. This may allow for an efficient, real-time adjustment of the acoustic signal.

In an alternative embodiment, the method further comprises training a neural network using a pre-determined set of sensor data, in particular one or more of pre-determined temperature data, altitude data and/or humidity data and outputting, by the neural network, a dynamic compensation transfer function, in particular the dynamic compensation transfer function as described above. An alternative option for the implementation of the dynamic compensation transfer function is by using artificial intelligence techniques. In this embodiment, a neural network is trained with a set of pre-determined sensor data including temperature data, altitude data and/or humidity data. The training of the neural network may further be based on an evaluation of an output audio signal and/or a reference audio signal, a change of an output audio signal and/or a deviation of an output audio signal from a reference audio signal. Based on these data, the neural network outputs a dynamic compensation transfer function for an optimized adjustment of the audio signal or part of the audio signal. Thereby changing parameters comprising current temperature, altitude, humidity as well as pre-set or current gain and/or time lag and may be included to the training of the neural network when needed. This approach enables optimized adjusting of the acoustic signals.

According to an embodiment, the one or more speakers are located in a closed environment, in particular in a vehicle. The sensors may be located within the closed environment. This allows for a controlled environment and more efficient tuning of the audio signal.

A further aspect of the present disclosure relates to a digital signal processor, DSP, configured to perform the method described above. All embodiments as described in relation to the method also apply for the DSP.

In an embodiment, the present disclosure relates to a system for adjusting an audio signal. The system comprises one or more sensors, one or more speakers and an amplifier, which includes a digital signal processor, DSP, configured to perform the above described method. According to an embodiment, the one or more sensors comprise one or more of a temperature sensor, an altitude sensor and/or a humidity sensor. If the method is applied in a vehicle, the sensor data may be retrieved from existing sensors and measurements. For instance, measurements of the temperature of the cabin of a vehicle may be performed for air conditioning systems. Similarly, sensor data indicative of altitude and humidity may be available from an engine control module as such parameters are necessary for combustion engines. The data may then be transferred to the amplifier using an existing vehicle communication bus. Further in an embodiment, the one or more speakers are located in a closed environment, in particular in a vehicle.

BRIEF DESCRIPTION OF THE DRAWINGS

The features, objects, and advantages of the present disclosure will become more apparent from the detailed description set forth below when taken in conjunction with the drawings in which like reference numerals refer to similar elements.

DETAILED DESCRIPTION

Figure 1:
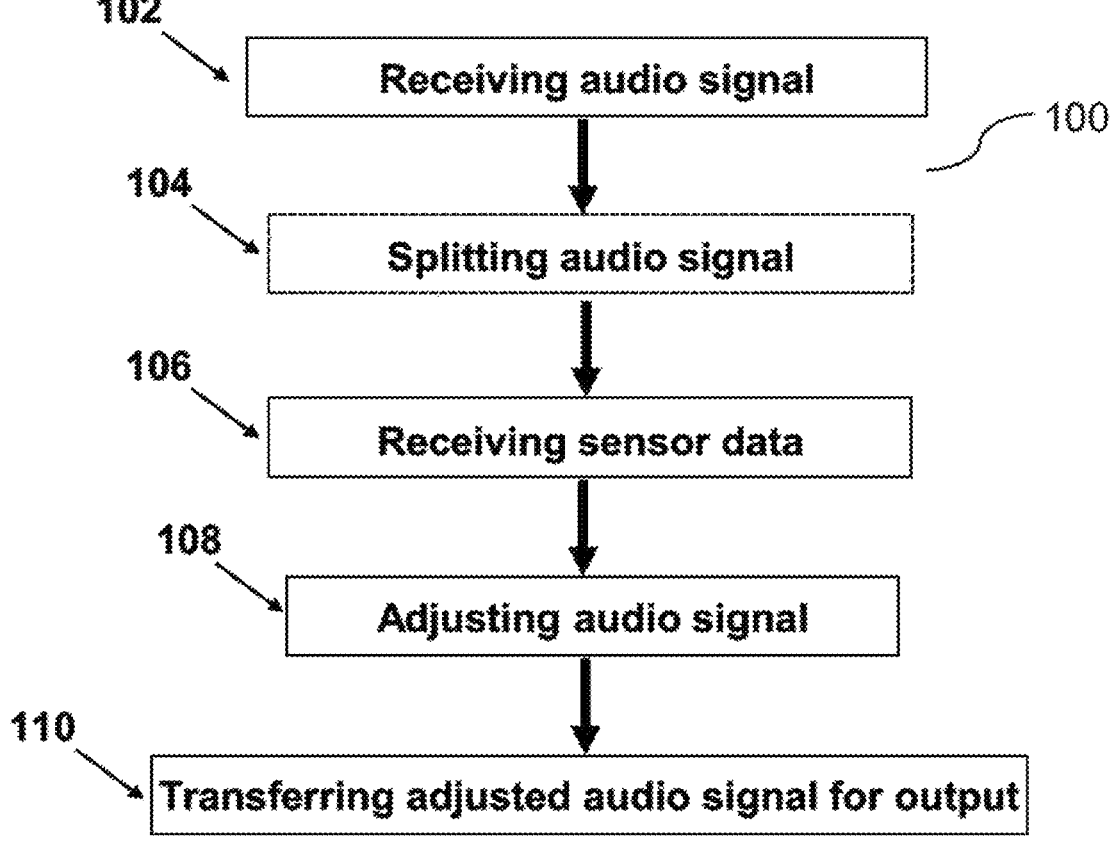
FIG. 1 depicts a flow chart of a method for adjusting an audio signal.

FIG. 1 depicts a flow chart of a method 100 for adjusting an audio signal using a digital signal processor ("DSP"). According to an embodiment, the method comprises receiving an audio signal in step 102. The DSP may receive the audio signal from an external source. In the next step 104, the methods may comprise splitting the audio signal into a plurality of signal bands using a plurality of digital filters. The audio signal may be split into a high, mid and low band signal channel. In the next step 106, the method comprises receiving sensor data. These sensor data are indicative of an air environment around one or more speakers. Sensor data may include one or more of temperature data, altitude data and humidity data. Step 108 comprises adjusting the audio signal according to the sensor data. Adjusting the audio signal includes adjusting a signal gain and a signal time lag of all signal bands or of individual signal bands. The adjustment is applied using a dynamic compensation transfer function. After adjusting the audio signal, the adjusted signal is transferred for output to one or more speakers in step 110.

Figure 2:
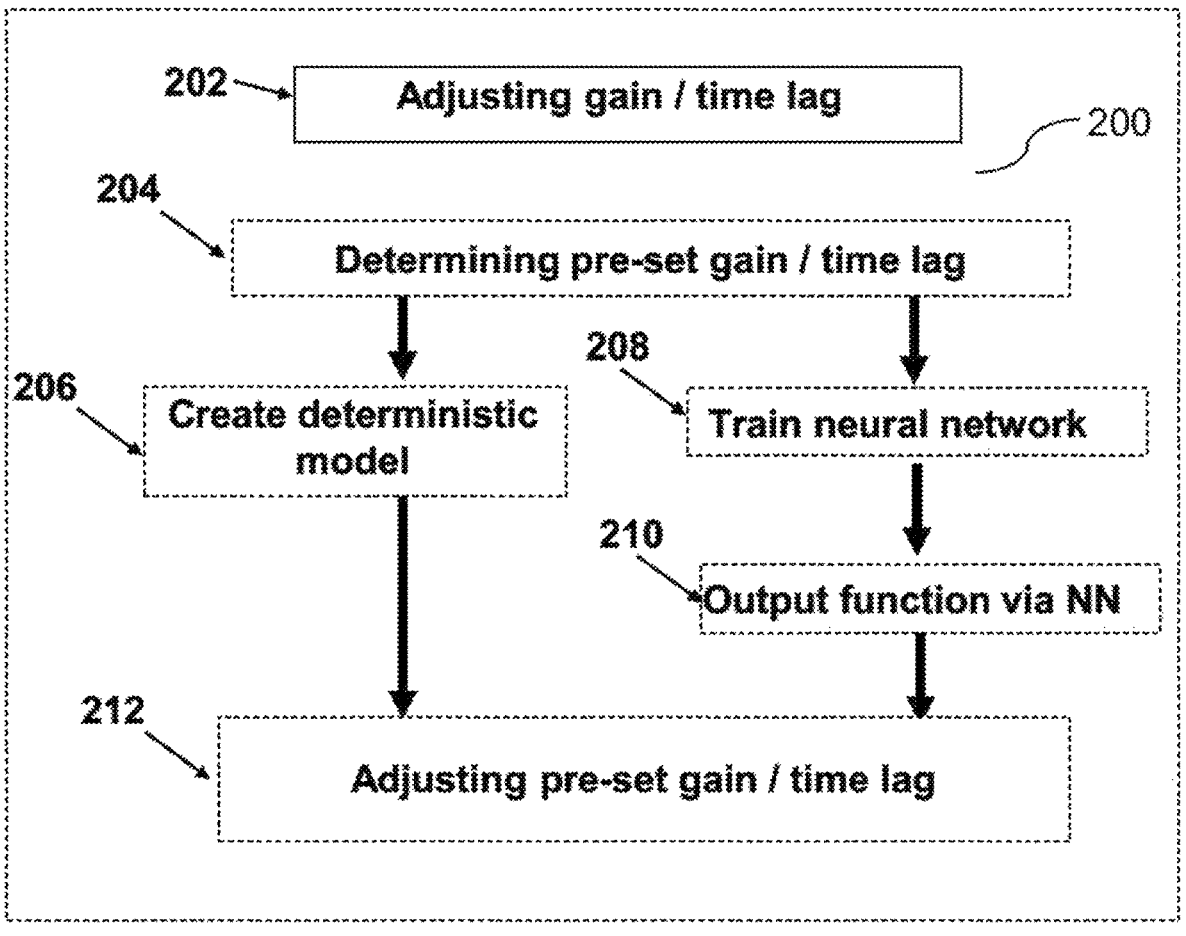
FIG. 2 depicts a flow chart of a method for adjusting gain and/or time lag.

FIG. 2 depicts a flow chart of a method 200 for adjusting a gain and/or a time lag (202). In step 204, a pre-set gain and/or time lag is determined. The pre-set parameters may be laboratory-set parameters or factory-set parameters. In step 206, a deterministic model of the gain and/or time lag of at least a part of the acoustic signal in dependence of the sensor data is created. In one embodiment, this is achieved using a dynamic compensation transfer function.

According to an alternative embodiment, a neural network is trained in step 208 using pre-determined sensor data, including temperature data, altitude data and/or humidity data as well as gains and time lags. In step 210, the neural network outputs an optimized dynamic compensation transfer function.

Either after step 206 or after step 210, at least parts of the acoustic signal is adjusted according to the environmental conditions, in particular the temperature, altitude and/or humidity, in step 212, if the pre-set gain and time lag differ from the optimized gain and time lag.

Figure 3:
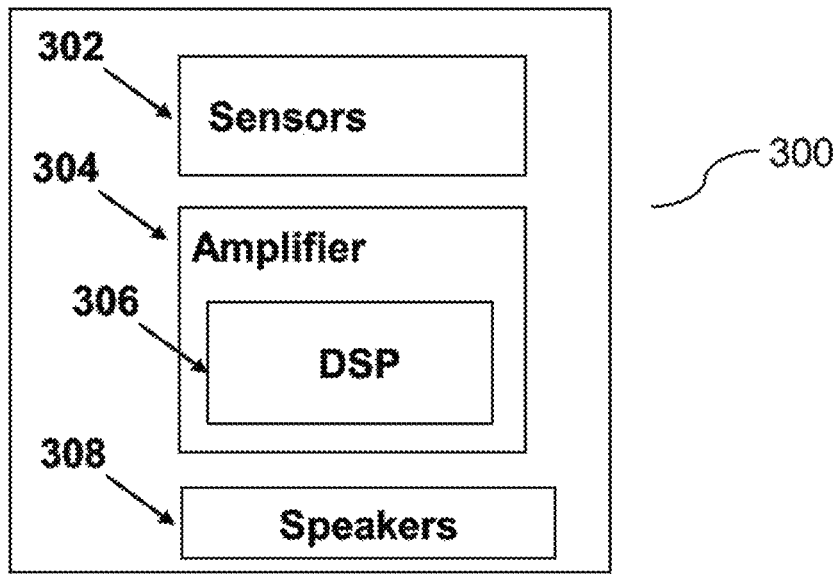
FIG. 3 depicts a block diagram of a system for adjusting an audio signal.

FIG. 3 depicts a block diagram of a system 300 for adjusting an audio signal. The system comprises one or more sensors 302, an amplifier 304 which includes a digital signal processor, DSP, 306 and one or more speakers 308. The DSP 306 is configured to execute the methods of all above embodiments. In a preferred embodiment, the sensors comprise one or more temperature sensors, altitude sensors and humidity sensors.

Figure 4:
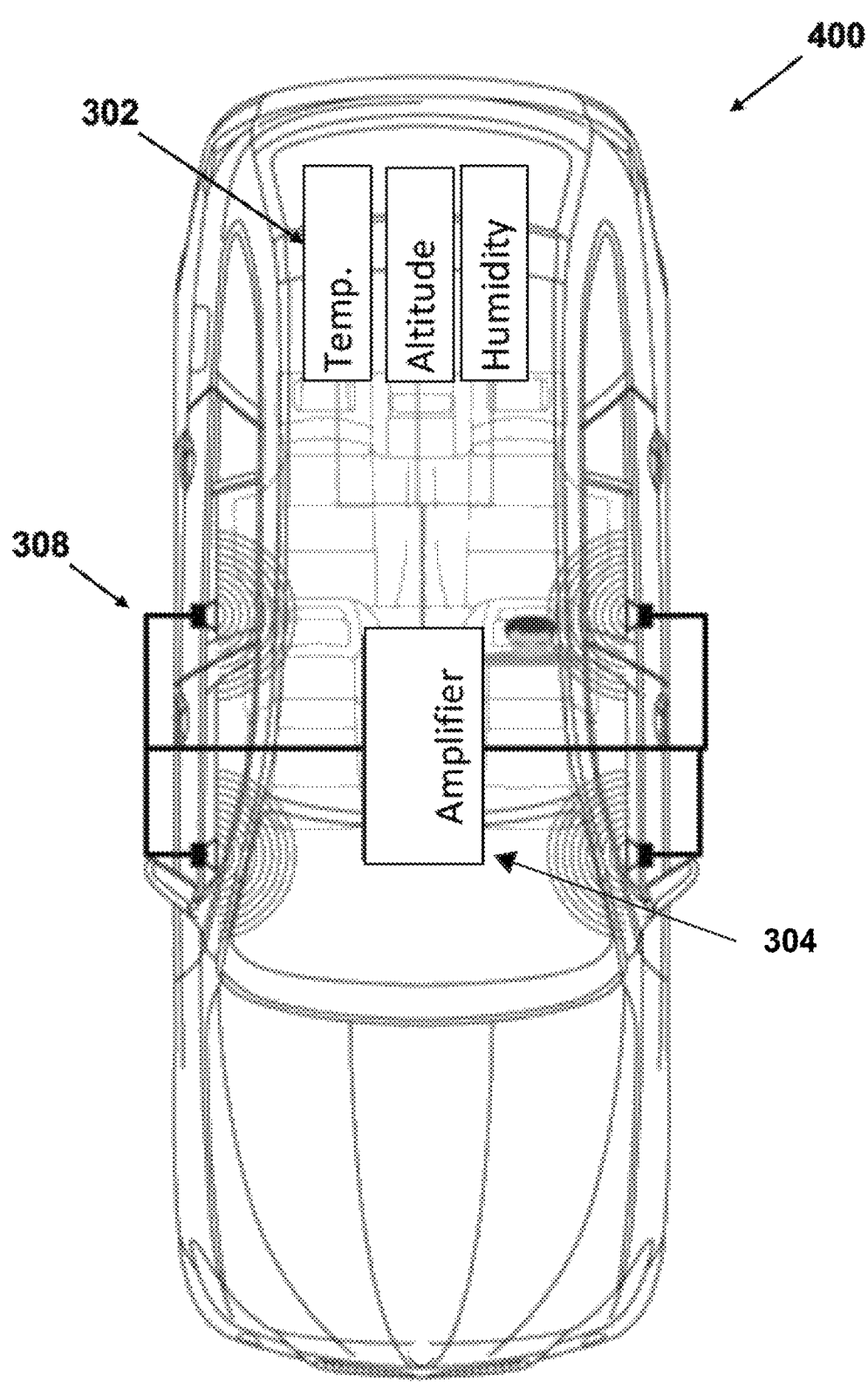
FIG. 4 depicts a schematic of an embodiment of a system for adjusting an audio signal in a vehicle.

FIG. 4 depicts a schematic of a preferred embodiment of the system for adjusting an audio signal in a vehicle 400. The one or more temperature sensors, altitude sensors and humidity sensors may be existing sensors in the vehicle. For example, a temperature sensor may exist as part of an air conditioning system, and altitude and humidity sensors may be included in an engine control module of a combustion engine.

REFERENCE SIGNS

100 Method for adjusting an audio signal
102-110 Steps of method 100
200 Method 200 for determining gains and/or time lags
202-212 Steps of method 200
300 System for adjusting an audio signal
302 Sensors
304 Amplifier
306 Digital signal processor, DSP
308 Speakers
400 Vehicle

What is claimed is:

1. A method for adjusting audio signals by a digital signal processor (DSP), the method comprising:
   receiving an audio signal;
   adjusting the audio signal; and
   transferring the adjusted audio signal to be output by one or more speakers;
   receiving sensor data indicative of an air environment around the one or more speakers;
   generating an optimized dynamic compensation transfer function by training a neural network using a pre-determined set of sensor data including pre-determined temperature data, altitude data, and humidity data; and
   adjusting the audio signal based on the sensor data and the dynamic compensation transfer function.

2. The method of claim 1, wherein the sensor data is indicative of the air environment around the one or more speakers comprise one or more of temperature data, altitude data or humidity data.

3. The method of claim 1, wherein adjusting the audio signal comprises adjusting the audio signal based on at least one of a frequency of the audio signal and splitting the audio signal into a plurality of signal bands using a plurality of digital filters.

4. The method of claim 1, wherein adjusting the audio signal further comprises adjusting at least one of a gain and a time lag of at least a part of the received audio signal and at least one of a plurality of signal bands of the received audio signal.

5. The method of claim 4, wherein adjusting the audio signal and the at least one of the gain and the time lag is based on the sensor data as an input of the dynamic compensation transfer function.

6. The method of claim 4, wherein adjusting the audio signal and at least one of the gain and the time lag comprises:
   determining at least one of a pre-set gain and a pre-set time lag of the audio signal or at least the part of the audio signal;
   determining at least one of an optimized gain and time lag based on the sensor data using a dynamic compensation transfer function; and
   adjusting the at least one of the pre-set gain and the time lag in response the at least one of the pre-set gain and the time lag differing from the at least one of the optimized gain and the time lag.

7. The method of claim 4, wherein adjusting the audio signal and the at least one of the gain and the time lag comprises:

determining a deterministic model of the gain and/or the time lag of the audio signal or at least part of the audio signal in dependence of the sensor data; and adjusting the audio signal or at least the part of the audio signal using the deterministic model.

8. The method of claim 1, wherein the one or more speakers are located in a closed environment of a vehicle.

9. A computer program product comprising a computer-readable storage medium including instructions that, when executed by the DSP perform the method of claim 1.

10. A system for adjusting audio signals, the system comprising:

one or more sensors;

one or more speakers;

an amplifier comprising a digital signal processor (DSP) and being configured to:

receive an audio signal;

adjust the audio signal;

transfer the adjusted audio signal to be output by the one or more speakers;

receive sensor data indicative of an air environment around the one or more speakers;

generate an optimized dynamic compensation transfer function by training a neural network using a pre-determined set of sensor data including pre-determined temperature data, altitude data, and humidity data; and adjust the audio signal based on the sensor data and the dynamic compensation transfer function.

11. The system of claim 10, wherein the one or more sensors comprise one or more of a temperature sensor, an altitude sensor and a humidity sensor.

12. The system of claim 10, wherein at least one of the one or more speakers and the amplifier are located in a closed environment of a vehicle.

13. A method for adjusting audio signals, the method comprising:

receiving an audio signal;

adjusting the audio signal;

outputting the adjusted audio signal via one or more speakers;

receiving sensor data indicative of an air environment around the one or more speakers;

generating an optimized dynamic compensation transfer function by training a neural network using a pre-determined set of sensor data including pre-determined temperature data, altitude data, and humidity data; and adjusting the audio signal based on the sensor data and the dynamic compensation transfer function.

14. The method of claim 13, wherein the sensor data indicative of the air environment around the one or more speakers comprise one or more of temperature data, altitude data or humidity data.

15. The method of claim 13, wherein adjusting the audio signal comprises adjusting the audio signal based on at least one of a frequency of the audio signal and splitting the audio signal into a plurality of signal bands using a plurality of digital filters.

16. The method of claim 13, wherein adjusting the audio signal further comprises adjusting at least one of a gain and a time lag of at least a part of the received audio signal and at least one of a plurality of signal bands of the received audio signal.

17. The method of claim 16, wherein adjusting the audio signal and the at least one of the gain and the time lag is based on the sensor data as an input of the dynamic compensation transfer function.

18. The method of claim 16, wherein adjusting the audio signal and at least one of the gain and the time lag comprises:

determining at least one of a pre-set gain and a pre-set time lag of the audio signal or at least the part of the audio signal;

determining at least one of an optimized gain and time lag based on the sensor data using a dynamic compensation transfer function; and adjusting the at least one of the pre-set gain and the time lag in response the at least one of the pre-set gain and the time lag differing from the at least one of the optimized gain and the time lag.

* * * * *